US012726194B2

(12) United States Patent
Miyashita

(10) Patent No.: US 12,726,194 B2
(45) Date of Patent: Sep. 1, 2026

(54) SWITCH DEVICE AND HARD DISK DEVICE

(71) Applicant: ROHM CO., LTD., Kyoto (JP)

(72) Inventor: Takashige Miyashita, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 232 days.

(21) Appl. No.: 18/607,099

(22) Filed: Mar. 15, 2024

(65) Prior Publication Data

US 2024/0322813 A1 Sep. 26, 2024

(30) Foreign Application Priority Data

Mar. 20, 2023 (JP) ................................ 2023-043992

(51) Int. Cl.
*H03K 17/082* (2006.01)
*G11B 5/49* (2006.01)

(52) U.S. Cl.
CPC ....... *H03K 17/0822* (2013.01); *G11B 5/4984* (2013.01); *G11B 2220/2516* (2013.01); *H03K 2217/0054* (2013.01)

(58) Field of Classification Search
CPC ............. H03K 17/082; H03K 17/0822; H03K 2217/0054; H03K 17/687; G11B 5/49; G11B 5/4984; H02H 3/18
USPC ............................ 361/56, 86–87, 93.7–93.9
See application file for complete search history.

(56) References Cited

U.S. PATENT DOCUMENTS

| | | | | |
|---|---|---|---|---|
| 7,589,510 B2 * | 9/2009 | Bodano | G05F 1/575 323/284 |
| 2001/0043112 A1 * | 11/2001 | Voldman | H10D 86/201 257/E29.281 |
| 2009/0284287 A1 * | 11/2009 | Kosuge | H03K 19/018521 327/108 |
| 2014/0160600 A1 * | 6/2014 | Maggio | H02H 3/18 361/18 |
| 2015/0137260 A1 * | 5/2015 | Matsui | H10D 64/112 257/390 |
| 2020/0083878 A1 * | 3/2020 | Namai | H03K 19/09421 |
| 2022/0319454 A1 * | 10/2022 | Tsuchi | G09G 3/36 |

FOREIGN PATENT DOCUMENTS

JP 2021-040482 3/2021

* cited by examiner

*Primary Examiner* — Danny Nguyen
(74) *Attorney, Agent, or Firm* — Fish & Richardson P.C.

(57) ABSTRACT

The present disclosure provides a switch device. The switch device includes: a switch element, including a gate, a drain, a source, a back gate, a first body diode disposed between the drain and the back gate and a second body diode disposed between the source and the back gate; a first switch circuit, including a first switch connected between the back gate and an application end at ground potential; and a second switch circuit, including a second switch connected between the back gate and the source.

15 Claims, 5 Drawing Sheets

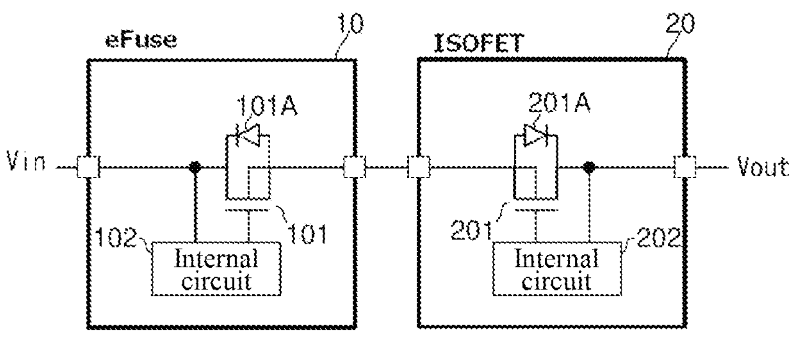
FIG. 1
BG
1A
1B
D
S
1
G
FIG. 2
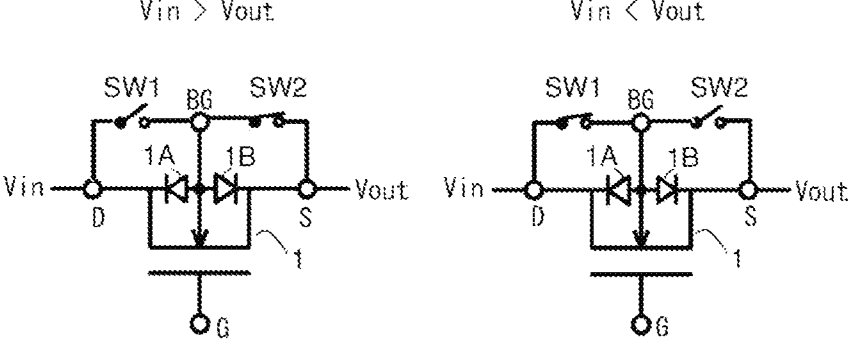
FIG. 3

SWITCH DEVICE AND HARD DISK DEVICE

TECHNICAL FIELD

The present disclosure relates to a switch device.

BACKGROUND

A conventional switch device using a switch element to implement a fuse function is known (for example, patent document 1). For example, the switch element is turned off upon detecting an overcurrent.

PRIOR ART DOCUMENT

Patent Publication

[Patent document 1] Japan Patent Publication No. 2021-40482

BRIEF DESCRIPTION OF THE DRAWINGS

FIG. 1 is a diagram of a configuration of a switch system of a comparison example.

FIG. 2 is a diagram of a configuration of a switch element of the present disclosure.

FIG. 3 is a diagram of an operation mode of a switch element of a comparison example.

DETAILED DESCRIPTION OF THE EMBODIMENTS

Figure 4:
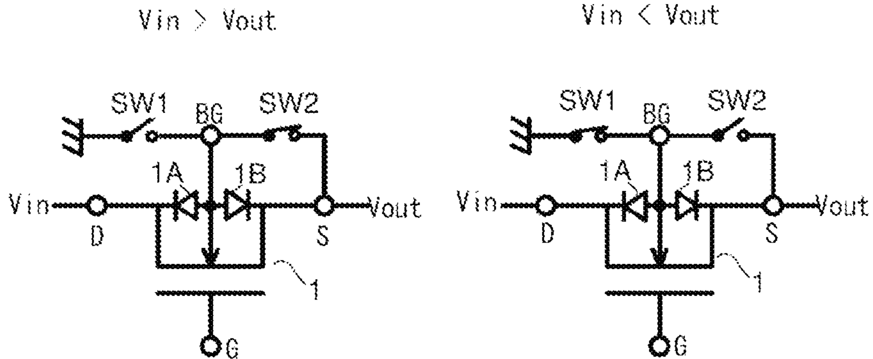
FIG. 4 is a diagram of an operation mode of a switch element of the present disclosure.

Details of the exemplary embodiments of the present disclosure are described with the accompanying drawings below.

1. Comparison Example

FIG. 1 shows a diagram of a configuration of a switch system of a comparison example. The switch system shown in FIG. 1 includes a switch device 10 in charge of an electronic fuse (eFUSE) function, and a switch device 20 in charge of an anti-backflow function (an ion-sensitive organic field effect transistor (ISOFET)).

The switch device 10 includes a switch element 101 and an internal circuit 102 integrated on one chip. The switch element 101 is formed by an N-channel metal-oxide-semiconductor field-effect transistor (NMOSFET). The switch element 101 is built-in with a body diode (a parasitic diode) 101A. A drain of the switch element 101 is connected to an application end of an input voltage Vin. The internal circuit 102 controls on/off of the switch element 101 by controlling a gate of the switch element 101.

The switch device 20 includes a switch element 201 and an internal circuit 202 integrated on one chip. The switch element 201 is formed by an NMOSFET. The switch element 201 is built-in with a body diode 201A. A source of the switch element 201 is connected to a source of the switch element 101. A drain of the switch element 201 is connected to an application end of an output voltage Vout. The internal circuit 202 controls on/off of the switch element 201 by controlling a gate of the switch element 201.

For example, upon detecting an overcurrent flowing through the switch device 10 or 20, the switch element 101 is turned off via the internal circuit 102 to implement the eFUSE function. However, when there is only the switch device 10, even if the switch element 101 is turned off, it remains possible that a current may flow in reverse from the side of the output voltage Vout through the body diode 101A to the side of the input voltage Vin. Thus, the switch device 20 is provided, and the body diode 101A and the body diode 201A are connected in directions opposite to each other, so as to suppress a backflow. Moreover, when the switch element 101 is turned off, the switch element 201 is also controlled to be off via the internal circuit 202.

In contrast, FIG. 2 shows a diagram of a configuration of a switch element 1 of the present disclosure. The switch element 1 is formed by an NMOSFET. According to the switch element 1, an eFUSE function and an anti-backflow function can be implemented via one field effect transistor (FET). The switch element 1 includes a drain D, a source S, a gate G and a back gate BG. In the switch element 1, because the back gate is not shorted with the source or the drain, a body diode 1A connected between the back gate and the drain and a body diode 1B connected between the back gate and the source are valid. The body diode 1A and the body diode 1B are connected in directions opposite to each other.

With such switch element 1, in comparison with the switch system of the comparison example, an area can be reduced if a same on resistance is formed by a same element with a same withstand voltage.

In case where the switch element 1 is used, an operation mode shown in FIG. 3 is available. In FIG. 3, a drain of the switch element 1 is connected to an application end of an input voltage Vin, and a source of the switch element 1 is connected to an application end of an output voltage Vout. Moreover, a first switch SW1 is connected between the drain and the back gate of the switch element 1, and a second switch SW2 is connected between the source and the back gate of the switch element 1.

On the left of FIG. 3, states of the switches SW1 and SW2 controlled in a condition where Vin>Vout are shown. More specifically, the switch SW1 is turned off and the switch SW2 is turned on. Accordingly, the body diode 1A is valid and the body diode 1B is invalid. Thus, when Vin>Vout, a current is prevented from flowing from the side of Vin to the side of Vout when the switch element 1 is turned off.

On the other hand, on the right of FIG. 3, states of the switches SW1 and SW2 controlled in a condition where Vin<Vout are shown. More specifically, the switch SW1 is turned on and the switch SW2 is turned off. Accordingly, the body diode 1A is invalid and the body diode 1B is valid. Thus, when Vin<Vout, a current can be prevented from flowing from the side of Vout to the side of Vin (achieving the anti-backflow function) when the switch element 1 is turned off.

However, in the operation mode of FIG. 3, it is possible that a high voltage is applied to the drain when the first switch SW1 is connected between the drain and the back gate, and it is then necessary to form the first switch SW1 by an element having a high withstand voltage, hence leading to an issue of an increased layout size.

2. Embodiments of Present Disclosure

<2-1. Operation Mode of Switch Element>

Thus, a switch element 1 in an operation mode of the present disclosure is as shown in FIG. 4. A difference from FIG. 3 is that, the first switch SW1 is not connected to the drain but is connected to an application end at ground potential. Accordingly, it is not necessary to form the first switch SW1 by an element having a high withstand voltage, and a layout size can then be reduced. For example, as to be described below, the first switch SW1 can be formed by one NMOS transistor.

<2-2. Switch Device>

A switch device of the present disclosure using the switch element 1 of the operation mode is described below.

Figure 5:
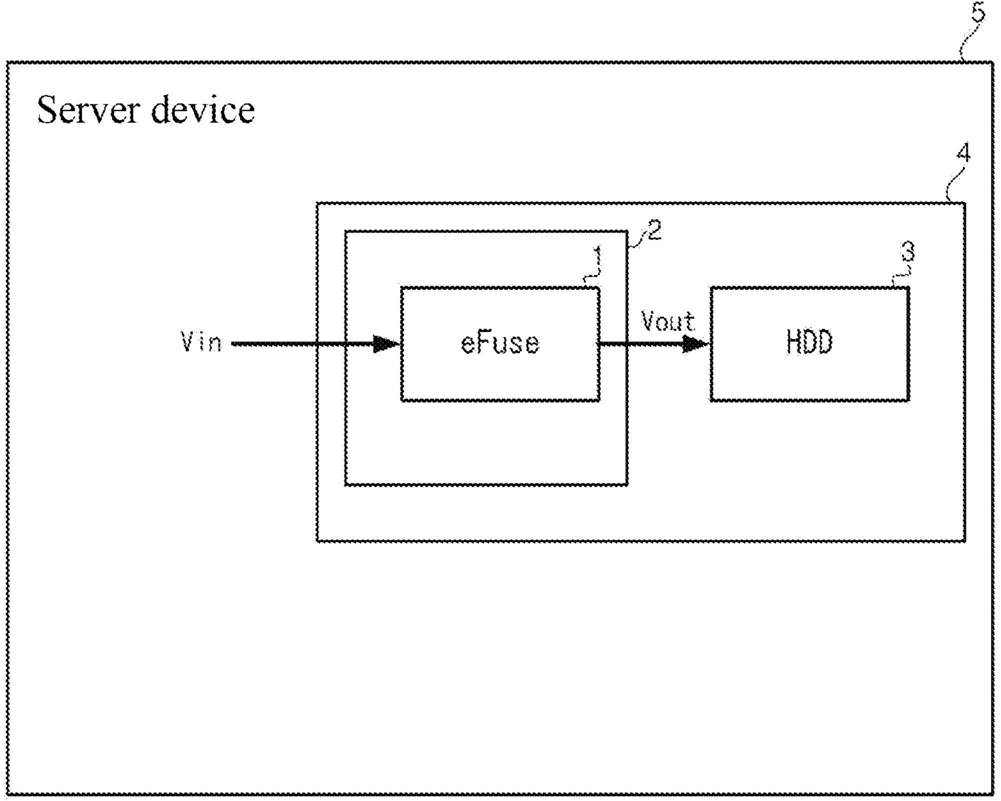
FIG. 5 is a schematic diagram of a configuration example of a server device.

FIG. 5 shows a brief schematic diagram of a configuration of a server device 5 as an example of an applicable application of a switch device of the present disclosure. Moreover, the switch device is not limited to being a server device but is also applicable to such as a charger.

The server device 5 shown in FIG. 5 includes a hard disk device 4. The hard disk device 4 includes a switch device 2 and a hard disk drive (HDD) 3.

The switch element 1 is provided in the switch device 2. The switch device 2 is a large-scale integration (LSI) having the switch element 1 and other circuits integrated on one chip. An input voltage Vin supplied from the server device 5 is applied to the switch element 1, and an output voltage Vout is output from the switch element 1. The output voltage Vout is supplied to the HDD 3.

The hard disk device 4 can be assembled into or removed from the server device 5 without turning off a power supply of the server device 5. That is to say, the so-called hot-plugging can be performed.

Figure 6:
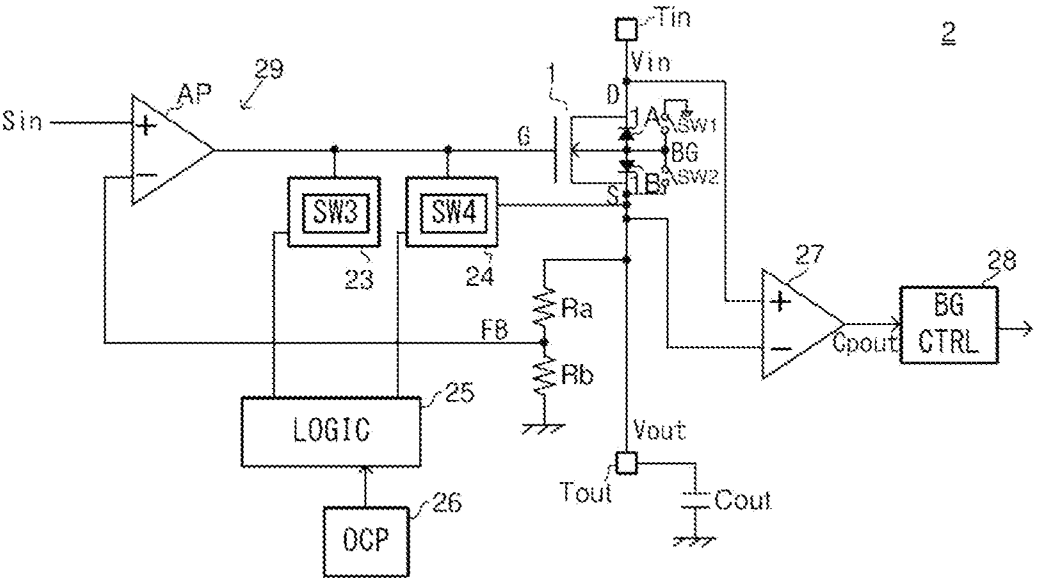
FIG. 6 is a diagram of a configuration of a switch device of the present disclosure.

FIG. 6 shows a diagram of a configuration of the switch device 2 of the present disclosure. The switch device 2 includes a switch element 1, a first switch SW1, a second switch SW2, a third switch circuit 23, a fourth switch circuit 24, a logic unit 25, an overcurrent detection unit 26, a comparator 27, a back gate control unit 28, and a low-dropout (LDO) 29.

As described above, the switch element 1 is built-in with the body diodes 1A and 1B connected in directions opposite to each other. The first switch SW1 is connected between the back gate and an application end at ground potential, and the second switch SW2 is connected between the back gate and the source. Moreover, as to be described below, the first switch SW1 is disposed in the first switch circuit 21, and the second switch SW2 is disposed in the second switch circuit 22. That is to say, the switch device 2 includes the first switch circuit 21 and the second switch circuit 22. A drain of the switch element 1 is connected to an input terminal Tin. The input voltage Vin is applied to the input terminal Tin. A source of the switch element 1 is connected to an output terminal Tout. The output voltage Vout is output from the output terminal Tout.

The third switch circuit 23 includes a third switch SW3, and controls a gate voltage of the switch element 1. The fourth switch circuit 24 includes a fourth switch SW4, and controls a gate-source voltage Vgs of the switch element 1. Details of the third switch circuit 23 and the fourth switch circuit 24 are described below.

The logic unit 25 controls such as the third switch circuit 23 and the fourth switch circuit 24. The overcurrent detection unit 26 is a circuit that detects an overcurrent flowing through the switch element 1.

A non-inverting input terminal of the comparator 27 is connected to the application end of the input voltage Vin. An inverting input terminal of the comparator 27 is connected to the application end of the output voltage Vout. Accordingly, the comparator 27 compares the input voltage Vin with the output voltage Vout, and outputs a comparison output signal Cpout to the back gate control unit 28. The back gate control unit 28 controls on/off of the first switch SW1 and the second switch SW2 according to a level of the comparison output signal Cpout.

The LDO 29 is a series voltage regulator that generates the output voltage Vout based on the input voltage Vin, and includes an error amplifier AP, the switch element 1, and voltage divider resistors Ra and Rb. An input signal Sin is input to a non-inverting input terminal of the error amplifier AP. The voltage divider resistors Ra and Rb are connected in series between the source of the switch element 1 and an application end at ground potential. A node connected with the voltage divider resistors Ra and Rb is connected to an inverting input terminal of the error amplifier AP. Accordingly, a feedback voltage FB obtained by dividing the output voltage Vout by the voltage divider resistors Ra and Rb is input to the error amplifier AP. An output terminal of the error amplifier AP is connected to the gate of the switch element 1. The error amplifier AP applies a signal amplifying a difference between the input signal Sin and the feedback signal FB to the gate.

Accordingly, the output voltage Vout is controlled by controlling the feedback voltage FB to be consistent with the input signal Sin. Herein, in order to prevent an inrush current from flowing into the large-capacity output capacitor Cout externally connected to the output terminal Tout when the switch element 1 is switched from an off state to an on state at startup, the input signal Sin is set to a ramp signal having a voltage value that gradually changes as time elapses. Accordingly, the output voltage Vout can be soft-started.

<2-3. Peripheral Circuits of Switch Element>

Figure 7:
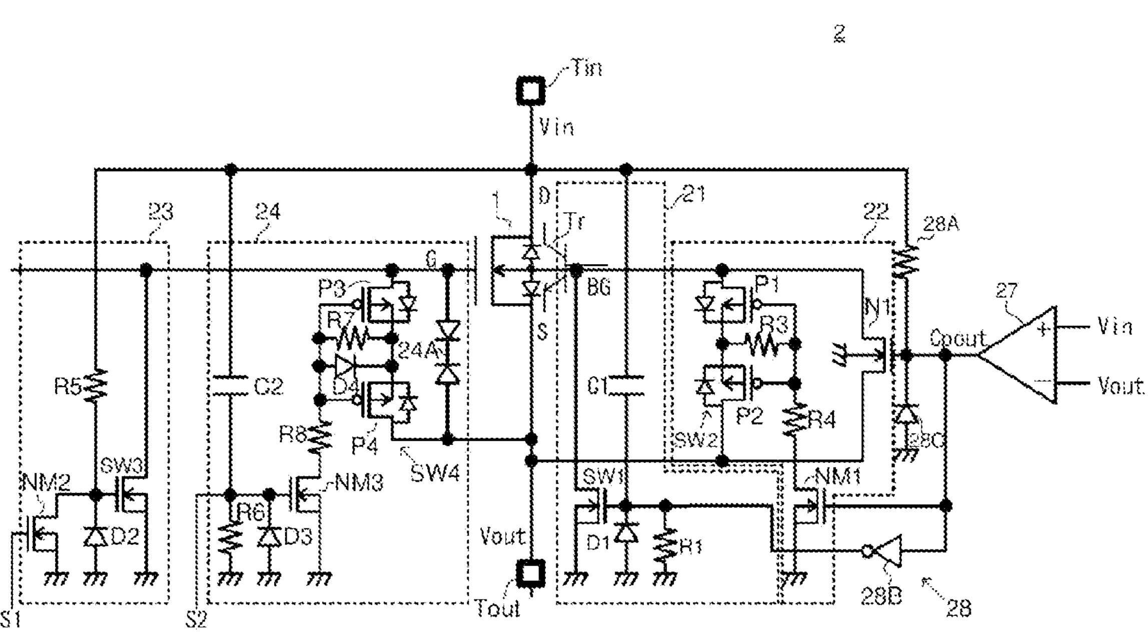
FIG. 7 is a diagram of peripheral circuits of a switch element in a switch device.

FIG. 7 shows a diagram of peripheral circuits of the switch element 1 in the switch device 2.

The first switch circuit 21 includes a first switch SW1, a capacitor C1, a Zener diode D1 and a resistor R1. The first switch SW1 is not necessarily formed by an element having a high withstand voltage as stated above, but is formed by an NMOS transistor. A drain of the first switch SW1 is connected to a back gate of the switch element 1. A source of the first switch SW1 is connected to an application end at ground potential.

One end of the capacitor C1 is connected to an input terminal Tin. The other end of the capacitor C1 is connected to a gate of the first switch SW1. The other end of the capacitor C1 is connected to one end of the resistor R1. A high-pass filter is formed by the capacitor C1 and the resistor R1. Accordingly, when a surge occurs in the input voltage Vin due to hot-plugging, the back gate can be set to the ground potential by turning on the first switch SW1. Thus, a parasitic NPN transistor Tr formed in the switch element 1 can be suppressed from operating and hence from causing a breakdown.

The Zener diode D1 is used to clamp a gate voltage of the first switch SW1.

The second switch circuit 22 includes a second switch SW2, resistors R3 and R4, and an NMOS transistor NM1.

The second switch SW2 includes an NMOS transistor N1 and PMOS transistors P1 and P2. A drain of the NMOS transistor N1 is connected to the back gate of the switch element 1. A source of the NMOS transistor N1 is connected to the output terminal Tout. Moreover, a back gate of the NMOS transistor N1 is connected to an application end at ground potential. The above is to prevent a reverse current flowing through a body diode of the NMOS transistor N1.

In order to reduce an on resistance of the second switch SW2, the PMOS transistors P1 and P2 are further used in addition to the NMOS transistor N1. The NMOS transistor N1 and the PMOS transistors P1 and P2 connected in series are configured to be connected in parallel between the back gate and the source of the switch element 1. Accordingly, the parasitic NPN transistor Tr can be suppressed from operating when the second switch SW2 is turned on. Moreover, it is not necessary to use PMOS transistors when an NMOS transistor having a lower on resistance is used.

In addition, two PMOS transistors P1 and P2 are used to prevent a reverse current. More specifically, a drain of the PMOS transistor P1 is connected to the back gate of the switch element 1. A source of the PMOS transistor P1 is connected to a source of the PMOS transistor P2. A drain of the PMOS transistor P2 is connected to the output terminal Tout. Accordingly, body diodes of the PMOS transistors P1 and P2 are connected in directions opposite to each other.

The resistor R3 is connected between the gate and the source of the PMOS transistor P1. By a current flowing through the body diode of the PMOS transistor P1 and the resistor R3, Vgs for setting the PMOS transistor P1 to be turned on is generated. A gate of the PMOS transistor P2 is connected to one end of the resistor R4. The other end of the resistor R4 is connected to a drain of the NMOS transistor NM1. A source of the NMOS transistor NM1 is connected to an application end at ground potential.

The back gate control unit 28 includes a pull-up resistor 28A, an inverter 28B and a Zener diode 28C. An output terminal of the comparator 27 and respective gates of the NMOS transistors N1 and NM1 are together connected to an input terminal of the inverter 28B. An output terminal of the inverter 28B is connected to the gate of the first switch SW1.

Accordingly, when Vin>Vout, a comparison output signal Cpout becomes at a high level, the NMOS transistor N1 is turned on, and the NMOS transistor NM1 is turned on. Accordingly, the PMOS transistors P1 and P2 are turned on. That is to say, the second switch SW2 is turned on. On the other hand, the first switch SW1 is turned off.

On the other hand, when Vin<Vout, the comparison output signal Cpout becomes at a low level, the NMOS transistor N1 is turned off, and the NMOS transistor NM1 is turned off. Accordingly, the PMOS transistors P1 and P2 are turned off. That is to say, the second switch SW2 is turned off. On the other hand, the first switch SW1 is turned on.

One end of the pull-up resistor 28A is connected to the input terminal Tin. The other end of the pull-up resistor 28A and a gate of the NMOS transistor N1 are together connected to a gate of the NMOS transistor NM1. As a result, when the input voltage Vin is applied, the second switch SW2 is turned on, and the voltage between the back gate and the source of the switch element 1 can be more reliably fixed at 0 V and activated. Moreover, the Zener diode 28C is used to clamp gate voltages of the NMOS transistors N1 and NM1.

The third switch circuit 23 includes a third switch SW3, a pull-up resistor R5, a Zener diode D2 and an NMOS transistor NM2.

The third switch SW3 is formed by an NMOS transistor. A drain of the third switch SW3 is connected to a gate of the switch element 1. A source of the third switch SW3 is connected to an application end at ground potential. One end of the pull-up resistor R5 is connected to the input terminal Tin. The other end of the pull-up resistor R5 is connected to a gate of the third switch SW3. With the pull-up resistor R5, since the third switch SW3 is set to be turned on when the input voltage Vin is applied, the gate voltage of the switch element 1 can be more reliably fixed at 0 V for activation.

A drain of the NMOS transistor NM2 is connected to a gate of the third switch SW3. A source of the NMOS transistor NM2 is connected to an application end at ground potential. With the logic unit 25 (FIG. 6), a control signal S1 is applied to a gate of the NMOS transistor NM2. Upon activation of the input voltage Vin, the control signal S1 is set to be at a low level, and the NMOS transistor NM2 is set to be turned off. Then, after activation of the input voltage Vin, the control signal S1 is set to be at a high level, and the NMOS transistor NM2 is set to be turned on. Accordingly, the third switch SW3 is turned off. Thus, gate control of the switch element 1 of the LDO 29 (FIG. 6) is effective.

The Zener diode D2 is used to clamp a gate voltage of the third switch SW3.

The fourth switch circuit 24 includes a fourth switch SW4, a diode pair 24A, resistors R6, R7 and R8, an NMOS transistor NM3, Zener diodes D3 and D4, and a capacitor C2.

The fourth switch SW4 is formed by the PMOS transistors P3 and P4. The two PMOS transistors P3 and P4 are used to prevent a reverse current. More specifically, a drain of the PMOS transistor P3 is connected to the gate of the switch element 1. A source of the PMOS transistor P3 is connected to a source of the PMOS transistor P4. A drain of the PMOS transistor P4 is connected to the output terminal Tout. Accordingly, body diodes of the PMOS transistors P3 and P4 are connected in directions opposite to each other.

The resistor R7 is connected between the gate and the source of the PMOS transistor P3. By a current flowing through the body diode of the PMOS transistor P3 and the resistor R7, Vgs for setting the PMOS transistor P3 to be turned on is generated. Respective gates of the PMOS transistors P3 and P4 are connected to one end of the resistor R8. The other end of the resistor R8 is connected to a drain of the NMOS transistor NM3. A source of the NMOS transistor NM3 is connected to an application end at ground potential.

Moreover, the Zener diode D4 is connected between the gates and sources of the PMOS transistors P3 and P4, and is used to clamp Vgs of the PMOS transistors P3 and P4. In addition, the diode pair 24A formed by Zener diodes connected in directions opposite to each other is connected between the gate and the source of the switch element 1. Accordingly, Vgs of the switch element 1 can be clamped while a reverse current can be prevented.

One end of the capacitor C2 is connected to an input terminal Tin. The other end of the capacitor C2 and a gate of the NMOS transistor NM3 are together connected to one end of the resistor R6. The other end of the resistor R6 is connected to an application end at ground potential. A high-pass filter is formed by the capacitor C2 and the resistor R6. Accordingly, when a surge occurs in the input voltage Vin due to hot-plugging, the NMOS transistor NM3 is set to be turned on and the fourth switch SW4 is set to be turned on, such that the gate and the source of the switch element 1 are shorted. Accordingly, the switch element 1 is prevented from turning on automatically.

Moreover, with the logic unit 25 (FIG. 6), a control signal S2 is applied to a gate of the NMOS transistor NM3. Since the control signal S2 is normally at a low level, the NMOS transistor NM3 is turned off and the fourth switch SW4 is turned off. On the other hand, when the overcurrent detection unit 26 detects an overcurrent, since the control signal S2 is at a high level, the NMOS transistor NM3 is turned on, the fourth switch SW4 is turned on, and the switch element 1 is turned off. Accordingly, an eFUSE function can be implemented.

Moreover, the Zener diode D3 is used to clamp Vgs of the NMOS transistor NM3.

<2-4. Layout of Switches>

Figure 8:
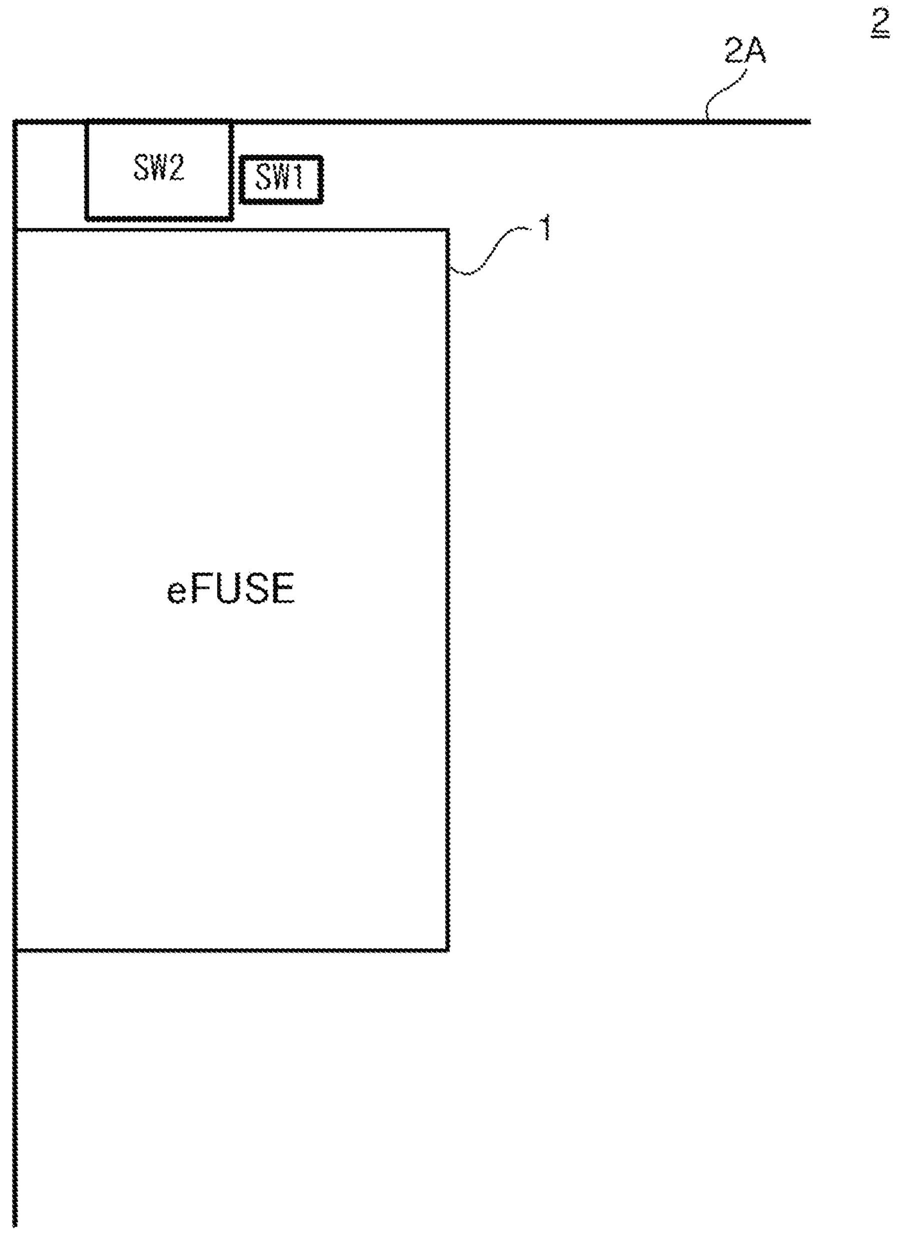
FIG. 8 is a brief diagram of a layout near chip edges of a chip in a switch device.

FIG. 8 shows a brief diagram of a layout near chip edges of a chip of the switch device 2. If the switch element 1 is disposed on a corner of the chip, space can be flexibly used by arranging the first switch SW1 and the second switch SW2 along a chip edge 2A.

3. Other

Various modifications may be made to the embodiments of the disclosure within the scope of the technical concept of the claims. The various embodiments and the variation examples provided so far in the description may be appropriately implemented in combination given that no contradictions are incurred. The embodiments above are only examples of possible implementation forms of the present disclosure, and the meanings of the terms of the present disclosure or the constituents are not limited to the meanings of the terms used in the embodiments above.

4. Notes

As described above, a switch device (2) in an aspect of the present disclosure is configured as (a first configuration) comprising:

- a switch element (1), including a gate, a drain, a source, a back gate, a first body diode (1A) disposed between the drain and the back gate and a second body diode (1B) disposed between the source and the back gate;
- a first switch circuit (21), including a first switch (SW1) connected between the back gate and an application end at ground potential; and
- a second switch circuit (22), including a second switch (SW2) connected between the back gate and the source.

Moreover, the first configuration can further be configured as (a second configuration) comprising:

- a comparator (27), configured to be input an input voltage (Vin) applied to the drain of the switch element (1) and an output voltage (Vout) applied to the source of the switch element, wherein
- the first switch and the second switch are controlled to be on/off based on an output of the comparator.

Moreover, the first or second configuration can further be configured as (a third configuration), wherein the first switch circuit (21) includes a first high-pass filter (C1, R1) connected between the drain of the switch element (1) and a control end of the first switch (SW1).

Moreover, any one of the first to third configurations can further be configured as (a fourth configuration), wherein the second switch (SW2) includes a first NMOS transistor (N1) and a first PMOS transistor (P1, P2) connected in parallel between the back gate and the source of the switch element.

Moreover, the fourth configuration can further be configured as (a fifth configuration), wherein the first PMOS transistor comprises two PMOS transistors (P1, P2) connected in a manner that body diodes of the two PMOS transistors are connected in directions opposite to each other.

Moreover, the fourth or fifth configuration can further be configured as (a sixth configuration), wherein

- the second switch circuit (22) includes a second NMOS transistor (NM1) having a drain connected to a gate of the first PMOS transistor (P1, P2), and
- the switch device (2) further includes a first pull-up resistor (28A) connected between the drain of the switch element (1) and gates of the first NMOS transistor (N1) and the second NMOS transistor.

Moreover, any one of the first to sixth configurations can further be configured as (a seventh configuration) further comprising a third switch circuit (23) including:

- a third switch (SW3), connected between the gate of the switch element (1) and an application end at ground potential; and
- a second pull-up resistor (R5), connected between the drain of the switch element and a control end of the third switch.

Moreover, the seventh configuration can further be configured as (an eighth configuration), wherein

- the third switch circuit (23) further includes a third NMOS transistor (NM2) connected between a control end of the third switch (SW3) and an application end at ground potential, and
- a first control signal (S1) is applicable to a gate of the third NMOS transistor from a first logic unit (25).

Moreover, the eighth configuration can further be configured as (a ninth configuration), wherein after activation of an input voltage (Vin) applied to the drain of the switch element (1), the first control signal (S1) is switched to a high level.

Moreover, any one of the first to ninth configurations can further be configured as (a tenth configuration) further comprising a fourth switch circuit (24) including:

- a fourth switch (SW4), connected between the gate of the switch element (1) and the source of the switch element;
- a fourth NMOS transistor (NM3), connected between a control end of the fourth switch and an application end at ground potential; and
- a second high-pass filter (C2, R6), connected between the drain of the switch element and a gate of the fourth NMOS transistor.

Moreover, the tenth configuration can further be configured as (an eleventh configuration), wherein the fourth switch (SW4) includes two second PMOS transistors (P3, P4) connected in a manner that body diodes of the two second PMOS transistors are connected in opposite directions.

Moreover, the tenth or eleventh configuration can further be configured as (a twelfth configuration), wherein in the fourth switch circuit (24), a diode pair (24A) including two diodes connected in directions opposite to each other is connected between the gate of the switch element (1) and the source of the switch element.

Moreover, any one of the tenth to twelfth configurations can further be configured as (a thirteenth configuration), wherein a second control signal (S2) is applicable to the gate of the fourth NMOS transistor (NM3) from a second logic unit (25), and the second control signal is switched to a high level when an abnormality is detected.

Moreover, any one of the first to thirteenth configurations can further be configured as (a fourteenth configuration), wherein the first switch (SW1) and the second switch (SW2) are arranged along a chip edge of a chip of the switch device (2).

Moreover, a hard disk device (4) in an aspect of the present disclosure is configured as (a fifteenth configuration) comprising:

the switch device (2) of any one of the first to fourteenth configurations, and an HDD (3), configured to be supplied with an output voltage (Vout) output from the source of the switch element (1).

INDUSTRIAL APPLICABILITY

The present disclosure is applicable to such as a hard disk device.

The invention claimed is:

1. A switch device, comprising:

a switch element, including a gate, a drain, a source, a back gate, a first body diode disposed between the drain and the back gate and a second body diode disposed between the source and the back gate;

a first switch circuit, including a first switch connected between the back gate and an application end at ground potential; and a second switch circuit, including a second switch connected between the back gate and the source, wherein the second switch includes a first NMOS transistor and a first PMOS transistor connected in parallel between the back gate and the source of the switch element, wherein the first PMOS transistor comprises two PMOS transistors connected in a manner that body diodes of the two PMOS transistors are connected in directions opposite to each other.

2. The switch device of claim 1, comprising:

a comparator, configured to be input an input voltage applied to the drain of the switch element and an output voltage applied to the source of the switch element, wherein the first switch and the second switch are controlled to be on/off based on an output of the comparator.

3. The switch device of claim 1, wherein the first switch circuit includes a first high-pass filter connected between the drain of the switch element and a control end of the first switch.

4. The switch device of claim 1, wherein the second switch circuit includes a second NMOS transistor having a drain connected to a gate of the first PMOS transistor, and the switch device further includes a first pull-up resistor connected between the drain of the switch element and gates of the first NMOS transistor and the second NMOS transistor.

5. The switch device of claim 1, further comprising a third switch circuit including:

a third switch, connected between the gate of the switch element and an application end at ground potential; and a second pull-up resistor, connected between the drain of the switch element and a control end of the third switch.

6. The switch device of claim 5, wherein the third switch circuit further includes a third NMOS transistor connected between a control end of the third switch and an application end at ground potential, and a first control signal is applicable to a gate of the third NMOS transistor from a first logic unit.

7. The switch device of claim 6, wherein after activation of an input voltage applied to the drain of the switch element, the first control signal is switched to a high level.

8. The switch device of claim 1, further comprising a fourth switch circuit including:

a fourth switch, connected between the gate of the switch element and the source of the switch element;

a fourth NMOS transistor, connected between a control end of the fourth switch and an application end at ground potential; and a second high-pass filter, connected between the drain of the switch element and a gate of the fourth NMOS transistor.

9. The switch device of claim 8, wherein the fourth switch includes two second PMOS transistors connected in a manner that body diodes of the two second PMOS transistors are connected in opposite directions.

10. The switch device of claim 8, wherein the in the fourth switch circuit, a diode pair including two diodes connected in directions opposite to each other is connected between the gate of the switch element and the source of the switch element.

11. The switch device of claim 8, wherein a second control signal is applicable to the gate of the fourth NMOS transistor from a second logic unit, and the second control signal is switched to a high level when an abnormality is detected.

12. The switch device of claim 1, wherein the first switch and the second switch are arranged along a chip edge of a chip of the switch device.

13. A hard disk device, comprising:

the switch device of claim 1; and an HDD, configured to be supplied with an output voltage output from the source of the switch element.

14. A hard disk device, comprising:

the switch device of claim 2; and an HDD, configured to be supplied with an output voltage output from the source of the switch element.

15. A switch device, comprising:

a switch element, including a gate, a drain, a source, a back gate, a first body diode disposed between the drain and the back gate and a second body diode disposed between the source and the back gate;

a first switch circuit, including a first switch connected between the back gate and an application end at ground potential;

a second switch circuit, including a second switch connected between the back gate and the source; and a comparator, configured to be input an input voltage applied to the drain of the switch element and an output voltage applied to the source of the switch element, wherein the first switch and the second switch are controlled to be on/off based on an output of the comparator.

* * * * *